(12) United States Patent
Seacrist (10) Patent No.: US 7,566,951 B2
(45) Date of Patent: Jul. 28, 2009

(54) SILICON STRUCTURES WITH IMPROVED RESISTANCE TO RADIATION EVENTS

(75) Inventor: Michael R. Seacrist, Lake Saint Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 268 days.

(21) Appl. No.: 11/408,503

(22) Filed: Apr. 21, 2006

(65) Prior Publication Data

US 2007/0249136 A1    Oct. 25, 2007

(51) Int. Cl.
*H01L 29/30* (2006.01)
*H01L 21/322* (2006.01)

(52) U.S. Cl. .............................. 257/655; 257/E33.043; 438/514; 117/2

(58) Field of Classification Search .................. 257/131, 257/611, 655; 438/478, 369, 495, 501, 510, 438/514; 117/2, 3; 148/33
See application file for complete search history.

(56) References Cited

U.S. PATENT DOCUMENTS

| | | | |
|---|---|---|---|
| 4,181,538 A * | 1/1980 | Narayan et al. ............. | 438/473 |
| 4,247,862 A | 1/1981 | Klein | |
| 4,394,191 A * | 7/1983 | Wada et al. ................ | 148/33.1 |
| 4,505,759 A | 3/1985 | O'Mara | |
| 5,024,723 A | 6/1991 | Goesele et al. | |
| 5,028,556 A | 7/1991 | Chang | |
| 5,098,482 A | 3/1992 | Warfield | |
| 5,189,500 A | 2/1993 | Kusunoki | |
| 5,296,731 A | 3/1994 | Morikawa | |
| 5,478,408 A | 12/1995 | Mitani et al. | |
| 5,504,018 A | 4/1996 | Sato | |
| 5,702,973 A | 12/1997 | Mitani et al. | |
| 5,731,626 A * | 3/1998 | Eaglesham et al. .......... | 257/607 |
| 5,872,374 A | 2/1999 | Tang et al. | |
| 5,904,769 A | 5/1999 | Ohashi et al. | |
| 5,929,482 A | 7/1999 | Kawakami et al. | |
| 5,993,555 A | 11/1999 | Hamilton | |
| 6,080,644 A | 6/2000 | Drobny et al. | |
| 6,127,230 A | 10/2000 | Tang et al. | |

(Continued)

FOREIGN PATENT DOCUMENTS

| | | |
|---|---|---|
| WO | 8602202 | 4/1986 |
| WO | 0145157 | 6/2001 |

OTHER PUBLICATIONS

Abe, T., "Innovated Silicon Crystal Growth and Wafering Technologies", *Electrochemical Society Proceedings*, 1997, pp. 123-133, vol. 97-3.

(Continued)

*Primary Examiner*—Matthew S. Smith
(74) *Attorney, Agent, or Firm*—Armstrong Teasdale LLP (57) ABSTRACT

A silicon structure with improved protection against failures induced by excess radiation-induced charge carrier migration from the bulk region into the near-surface region. The structure comprises bulk and near-surface regions that are doped with a dopant, wherein the concentration in the near-surface region is at least 10 times the maximum concentration, c, of dopant in the bulk region. The structure further comprises a transition region between the bulk and near-surface regions extending less than about 1 μm from the near-surface region toward the central plane.

49 Claims, 8 Drawing Sheets

U.S. PATENT DOCUMENTS

| | | |
|---|---|---|
| 6,171,389 B1* | 1/2001 | Anderson .................... 117/2 |
| 6,236,104 B1 | 5/2001 | Falster |
| 6,284,384 B1 | 9/2001 | Wilson et al. |
| 6,339,016 B1 | 1/2002 | Torack et al. |
| 6,350,315 B2 | 2/2002 | Anderson |
| 6,537,368 B2 | 3/2003 | Falster et al. |
| 6,537,655 B2 | 3/2003 | Wilson et al. |
| 6,596,095 B2 | 7/2003 | Ries et al. |
| 6,666,915 B2 | 12/2003 | Yang et al. |
| 6,921,943 B2 | 7/2005 | Kenney et al. |
| 6,946,711 B2 | 9/2005 | Suzuki et al. |
| 6,958,092 B2 | 10/2005 | Wilson et al. |
| 7,105,427 B1* | 9/2006 | Chu et al. .................. 438/530 |
| 2005/0000449 A1* | 1/2005 | Ishibashi et al. ............ 118/728 |
| 2006/0027897 A1* | 2/2006 | Kusaba et al. ............... 257/617 |

OTHER PUBLICATIONS

Cheung, N.W., "Plasma Immersion Ion Implantation for Semiconductor Processing", *Materials Chemistry and Physics*, 1996, pp. 132-139, vol. 46.

Kaiser, W., et al., "Mechanism of the Formation of Donor States in Heat-Treated Silicon", *Physical Review*, Dec. 1, 1958, pp. 1546-1554, vol. 112, No. 5.

Nadahara, S., et al., "Hydrogen Annealed Silicon Wafer", *Solid State Phenomena*, 1997, pp. 19-26, vols. 57-58.

Shimura, F., "Semiconductor Silicon Crystal Technology", pp. 360-377, Academic Press, Inc.

Ziegler, J., et al., "Process Techniques to Improve SER Immunity", SER—History, Trends and Challenges, 2004, pp. 6-1-6-15, Cypress.

International Search Report, PCT/US2007/066566, dated Sep. 4, 2007, 4 pages.

* cited by examiner

SILICON STRUCTURES WITH IMPROVED RESISTANCE TO RADIATION EVENTS

FIELD OF THE INVENTION

The present invention generally relates to a silicon structure. More particularly, the invention relates to a silicon structure with improved resistance to failure induced by exposure to ionizing radiation.

BACKGROUND OF THE INVENTION

During routine use, integrated circuits (ICs) are exposed to varying levels of radiation. However, in some applications, an IC's single crystal silicon wafer is exposed to a level of radiation sufficient to induce a single or soft error failure, i.e., a radiation event. Such failures are initiated by the introduction of excess charge carriers (i.e., electrons) in the wafer's electrical device region upon exposure to the ionizing radiation. These failures can cause electronic devices to lock-up or reset, and could potentially lead to the recall of computer workstations or large scale disruptions in chips controlling router systems. Singe crystal silicon wafers have become more susceptible to such failures as the wafers and the electrical devices thereon have decreased in size, such as in sub-100 nm device technologies. Examples of electronic device applications that are increasingly sensitive to radiation-induced failures include logic, memory, and analog applications, including microprocessors, digital signal processors, microcontrollers, logic/ASIC, DRAM, SRAM, flash memory, and mixed signal devices.

Figure 1:
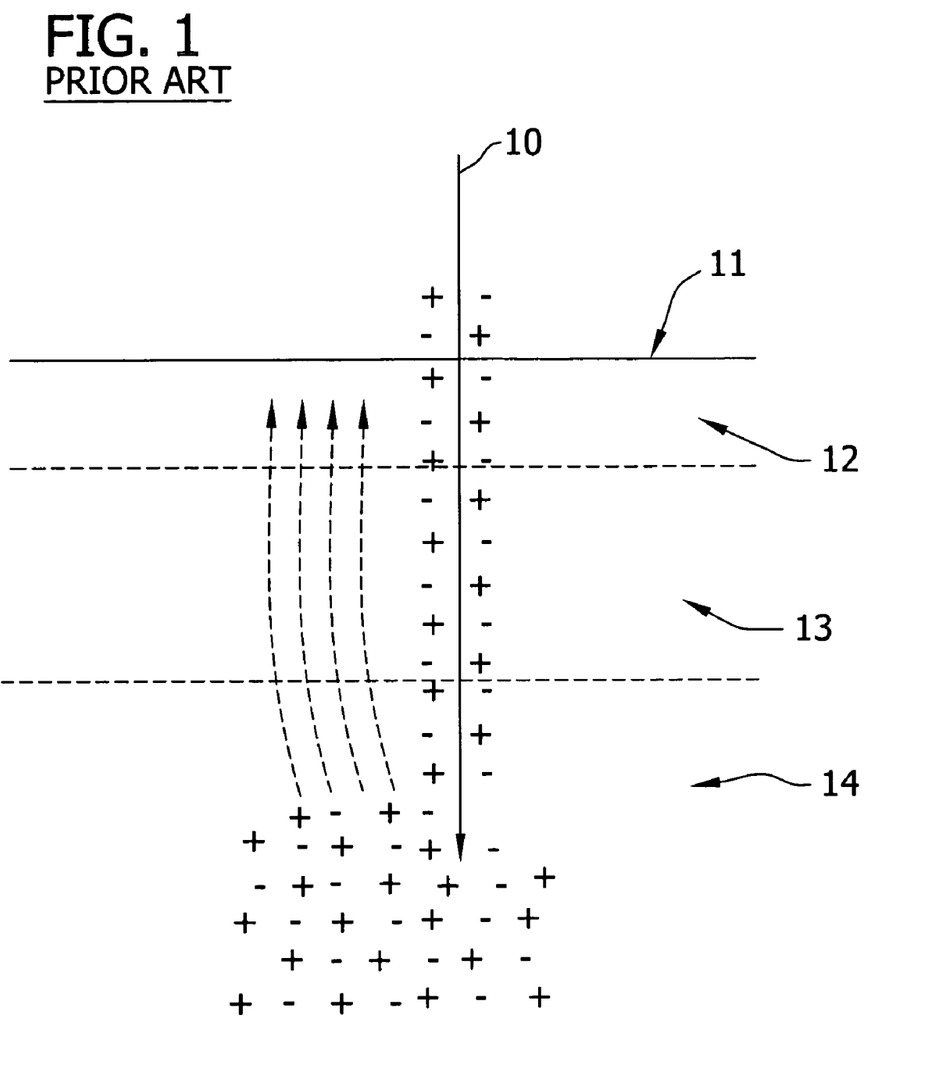
FIG. 1 is a schematic representation of charge carriers generated during a typical radiation event.

More specifically, referring to FIG. 1, a radiation event is characterized by ionizing radiation 10, e.g., alpha particles or high energy neutrons, penetrating the silicon wafer surface 11 to generate excess charge carriers throughout the structure, including the device layer 12, the near-surface region 13, and the bulk region 14. The excess charge carriers, shown as "+" and "−" in FIG. 1, are generated along the ionizing radiation 10 path through the structure to a depth proportional to the energy of the ionizing radiation. These charge carriers can then migrate into the near-surface region 13 or, more importantly, into the device region 12 within a few pico-, nano-, or microseconds, which is represented in FIG. 1 by the dashed arrows. These excess charge carriers may alter the charge state of features such as junctions in device layer 12, thereby leading to electronic device failure. The failure may be temporary and recoverable, or permanent, resulting in damage to the device itself.

Both smaller electronic device dimensions and higher density of devices on a given structure increase a silicon structure's sensitivity to radiation-induced events. At smaller dimensions, the capacitance at electrical junctions decreases, thereby reducing the critical number of excess electrons necessary to alter the junction's electrical condition.

Several approaches have been developed to protect against radiation-induced failures. Solutions involving complex error detection and correction schemes are viable, but introduce greater complexity and higher cost to the wafer's production regarding both design and chip area. Such solutions may also slow the device's operation. Alternatively, protection schemes such as adding capacitors, resistors, or additional transistors to critical nodes may also be used, but present disadvantages related to circuit speed and increased chip area. Furthermore, silicon-on-insulator (SOI) wafers can significantly reduce susceptibility to such failures based on structural aspects of the wafer design, but they represent significant additional wafer cost as well as increased design and process complexity.

Conventional silicon polished and standard epitaxial wafers lack sufficient structural protection from ionizing radiation events. In fact, the commonly employed epitaxial wafer configuration of a p-doped epitaxial layer on a more highly-doped (i.e., p+) substrate actually promotes retention of charge carriers generated in the epitaxial layer within the epitaxial layer itself. Furthermore, as suggested above, employing an SOI wafer in place of a bulk polished wafer or epitaxial wafer is not always feasible based on their significantly increased cost as well as the requisite process and design modifications for integration in the wafer processing.

SUMMARY OF THE INVENTION

Among the various aspects of the present invention is a silicon structure with improved resistance to migration of charge carriers into the wafer's transition and near-surface region, thereby reducing susceptibility to failures resulting from ionizing radiation-induced events.

Briefly, therefore, the present invention is directed to a silicon structure having a central axis, a front surface and a back surface that are generally perpendicular to the central axis, a central plane between and parallel to the front and back surfaces, a circumferential edge, and a radius extending from the central axis to the circumferential edge. The structure further comprises a near-surface region extending substantially from the central axis to the circumferential edge and a distance, $D_1$, of between about 0.5 μm and about 25 μm from the front surface toward the central plane. The structure also comprises a transition region extending substantially from the central axis to the circumferential edge and a distance, $D_2$, of less than about 1 μm from the near-surface region toward the central plane. The structure further comprises a bulk region extending substantially from the central axis to the circumferential edge and a distance, $D_3$, of greater than about 5 μm from the transition region toward the central plane, wherein the bulk and near-surface regions are doped with a dopant and the concentration in the near-surface region is at least 10 times the maximum concentration, c, of dopant in the bulk region.

The present invention is further directed to a silicon structure having a central axis, a front surface and a back surface that are generally perpendicular to the central axis, a central plane between and parallel to the front and back surfaces, a circumferential edge, and a radius extending from the central axis to the circumferential edge. The structure further comprises a near-surface region extending substantially from the central axis to the circumferential edge and a distance, $D_1$, of between about 2.75 μm and about 3 μm from the front surface toward the central plane. Also, the structure comprises a transition region extending substantially from the central axis to the circumferential edge and a distance, $D_2$, of less than about 1 μm from the near-surface region toward the central plane. The structure further comprises a bulk region extending substantially from the central axis to the circumferential edge and from the transition region to the back surface, wherein the bulk region is doped with a dopant in a maximum dopant concentration of about $1 \times 10^{14}$ atoms/cm$^3$ and the near-surface region is doped with a dopant in a concentration of at least about $1 \times 10^{16}$ atoms/cm$^3$.

The present invention is still further directed to a method for forming a silicon structure on a silicon substrate, the substrate having a central axis, a front surface and a back surface that are generally perpendicular to the central axis, a central plane between and parallel to the front and back surfaces, a circumferential edge, and a radius extending from the central axis to the circumferential edge. The method comprises forming a bulk region in the substrate, the bulk region being doped with a maximum dopant concentration of c and extending substantially from the central axis to the circumferential edge and a distance, $D_3$, from the front surface of the substrate toward the central plane of at least about 5 μm. The method also comprises forming a transition region of doped silicon on the front surface of the substrate, the transition region extending substantially from the central axis to the circumferential edge and having a thickness, $D_2$, of less than about 1 μm. The method further comprises forming a near-surface region of doped silicon on the transition region, the near-surface region being doped with a dopant concentration of at least about 10 times c and extending substantially from the central axis to the circumferential edge and having a thickness, $D_1$, of between about 0.5 μm and about 25 μm.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE INVENTION

The present invention is directed to a silicon structure having a dopant concentration profile designed to minimize excess charge carrier (i.e., electron) migration into a transition and/or near-surface region from a bulk region of the structure. In this way, the structure of the invention provides enhanced resistance to failure from radiation-induced events.

Figure 2:
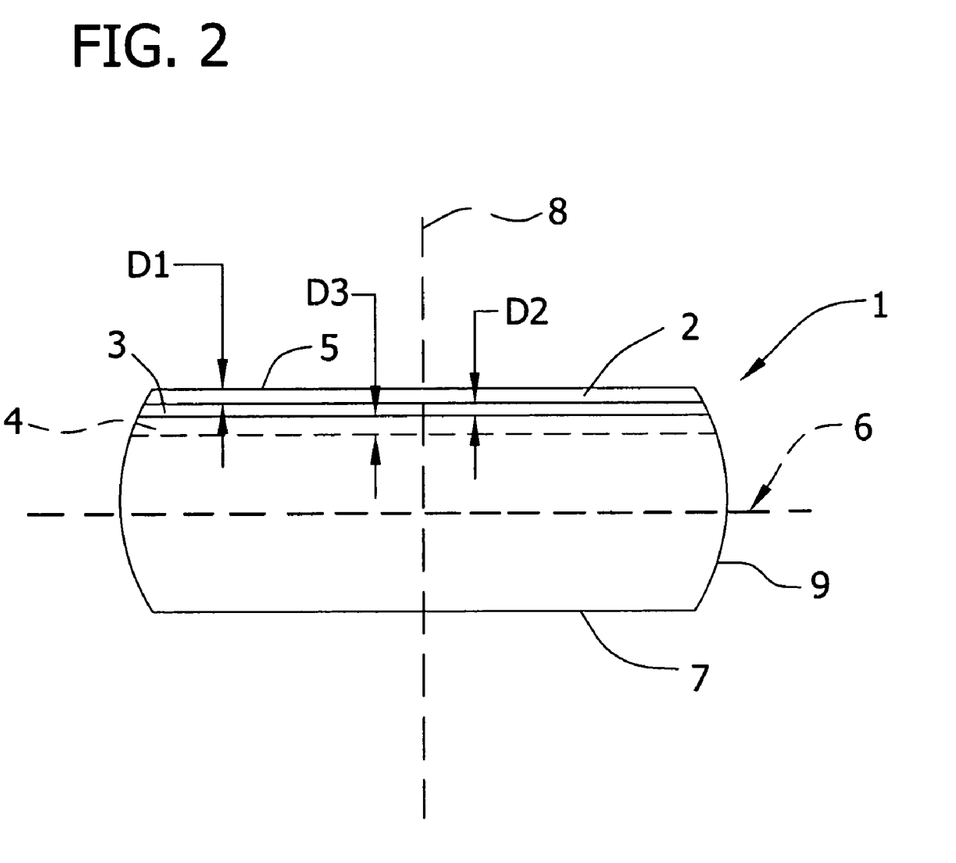
FIG. 2 is a schematic representation of the silicon structure of the invention.

Referring now to FIG. 2, silicon structure 1 is a disk-shaped structure having a front surface 5, a back surface 7, and a circumferential edge 9 joining front and back surfaces 5 and 7. Central axis 8 is generally perpendicular to front surface 5 and back surface 7. Imaginary central plane 6 is equidistant from front surface 5 and back surface 7. Between front surface 5 and imaginary central plane 6, silicon structure 1 comprises near-surface region 2, transition region 3, and bulk region 4, each of which extends substantially from central axis 8 to circumferential edge 9. In general, near-surface region 2 has a dopant concentration that is at least ten times greater than the concentration of dopant in bulk region 4, with the change in dopant concentration occurring in transition region 3.

Typically, near-surface region 2 and bulk region 4 are each of the same dopant type, that is, either p-type or n-type. For example, near-surface region 2 and bulk region 4 may be p-type material with the p-type dopant typically being boron. By way of further example, near-surface region 2 and bulk region 4 may alternatively be n-type material with the n-type dopant typically being phosphorous. In each instance, the change in dopant concentration occurs in transition region 3.

Depending upon the type of electronic device to be fabricated in silicon structure 1, the interface between near-surface region 2 and transition region 3 occurs at a distance of about 0.5 μm to about 25 μm, measured from front surface 5 in the direction of central plane 6. The resulting thickness of near-surface region 2 is shown FIG. 2 as $D_1$. In one embodiment, $D_1$ is between about 0.5 μm and about 4 μm. In another embodiment, $D_1$ is between about 6 μm and about 10 μm. In yet another embodiment, $D_1$ is between about 10 μm and about 25 μm.

Transition region 3 has a thickness, $D_2$, not in excess of about 1 μm. In general, the variation in $D_2$ is dependent on the technique used to create the dopant concentration profile in the structure and whether a stepped or steeply graded dopant profile is desired. When the dopant concentration profile is graded, $D_2$ is some measurable thickness, preferably less than about 1 μm. When the concentration profile is stepped, $D_2$ may be approximately 0 μm. The dopant profile within transition region 3 is not narrowly critical, provided the dopant concentration is steeply graded or stepped from the lesser bulk region concentration to the greater near-surface region concentration over the distance $D_2$, which may be from about 0 μm to about 1 μm.

The dopant concentration in near-surface region 2 is at least about ten times the maximum dopant concentration in the bulk region 4. That is, if the maximum dopant concentration of the bulk region is referred to as c, the dopant concentration of the near-surface region is at least about 10 times c. For example, the concentration of dopant in near-surface region 2 is preferably at least about 100c, and even more preferably at least about 1000c. In absolute terms, if c is about $5\times10^{13}$ atoms/cm$^3$, then the dopant concentration in the near-surface region is at least about $5\times10^{14}$ atoms/cm$^3$, preferably at least about $1\times10^{15}$ atoms/cm$^3$, and even more preferably at least about $5\times10^{16}$ atoms/cm$^3$.

As noted, bulk region 4 extends substantially from the central axis to the circumferential edge and from transition region 3 toward the central plane 6. Bulk region 4 has a thickness, $D_3$, and a maximum dopant concentration, c, that is sufficient to inhibit electron migration into the transition region 3 and near-surface regions 2. In general, $D_3$ is at least about 5 μm. For example, in one embodiment, $D_3$ is at least about 10 μm. Typically, $D_3$ is at least about 20 μm. Still more typically, bulk region 4 extends from transition region 3 to imaginary central plane 6. In addition, bulk region 4 has a concentration of dopant, c, that is at least about $5\times10^{13}$ atoms/cm$^3$. For certain applications, c is greater than about $1\times10^{14}$ atoms/cm$^3$. For some applications, c is still greater; that is at least about $1\times10^{15}$ atoms/cm$^3$.

Figure 3:
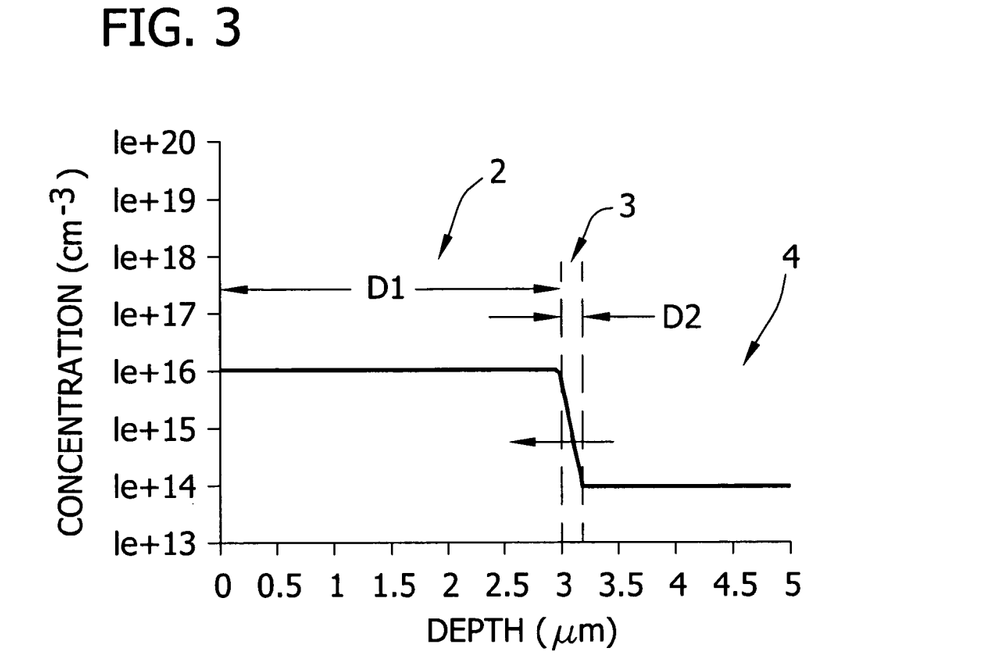
FIG. 3 is a doping concentration profile for a silicon structure of the invention.
Figure 4:
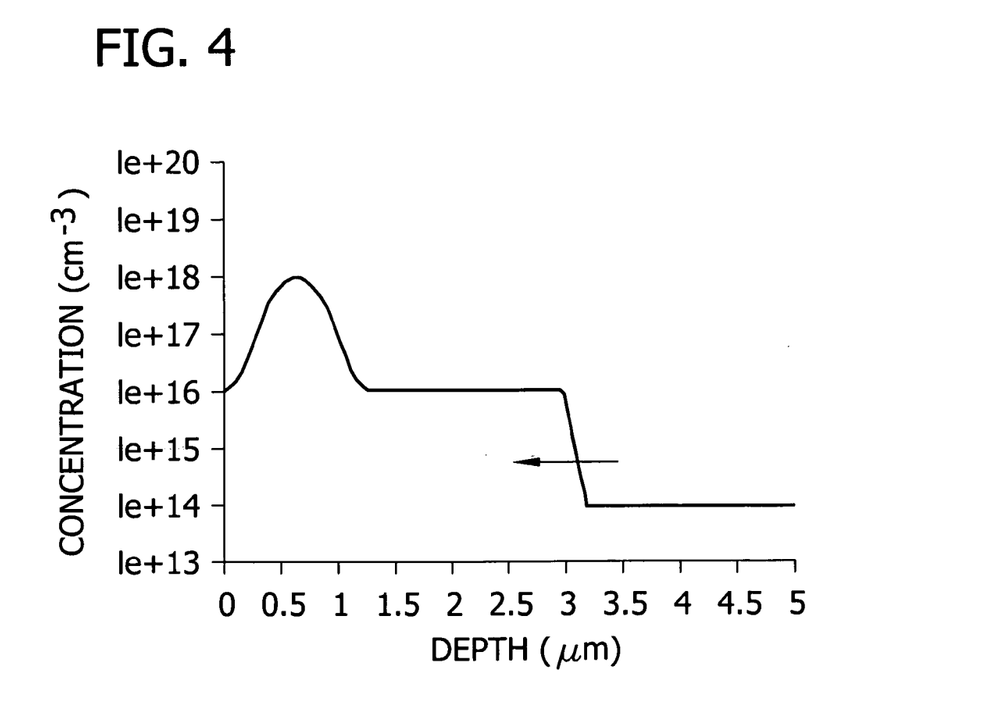
FIG. 4 is a doping concentration profile for a silicon structure of the invention after subsequent p-type doping.

In some applications, a dopant concentration peak, known as a p-well or an n-well, is selectively implanted in portions of surface region 2 using any known technique, such as a masking process. The depth of this peak varies based on the type of electronic device to be fabricated in silicon structure 1 and the corresponding dopant type. For example, FIG. 3 shows a typical dopant concentration profile for a p-doped silicon structure before formation of a p-well therein, the silicon structure having a surface region 2, a transition region 3, and a bulk region 4. To form a p-well in such a p-doped structure, p-type dopant is implanted in surface region 2 with sufficient energy to form a local concentration peak, i.e., in a region between about 0.5 μm and about 2.0 μm below the front surface. As mentioned above, this local concentration peak is selectively formed in discrete areas of the wafer's front surface using an implantation process such as, for example, one of the commonly known masking techniques. Stated otherwise, isolated areas of the wafer's surface are subjected to dopant implantation to form one or more p-wells in the wafer's surface region 2. The concentration peak of the p-well is typically at least about 10 times the dopant concentration of the surface region 2, and preferably at least about 100 times the dopant concentration of the surface region 2. FIG. 4 represents an exemplary dopant concentration profile for a p-type silicon structure after a p-well has been formed therein.

Figure 5:
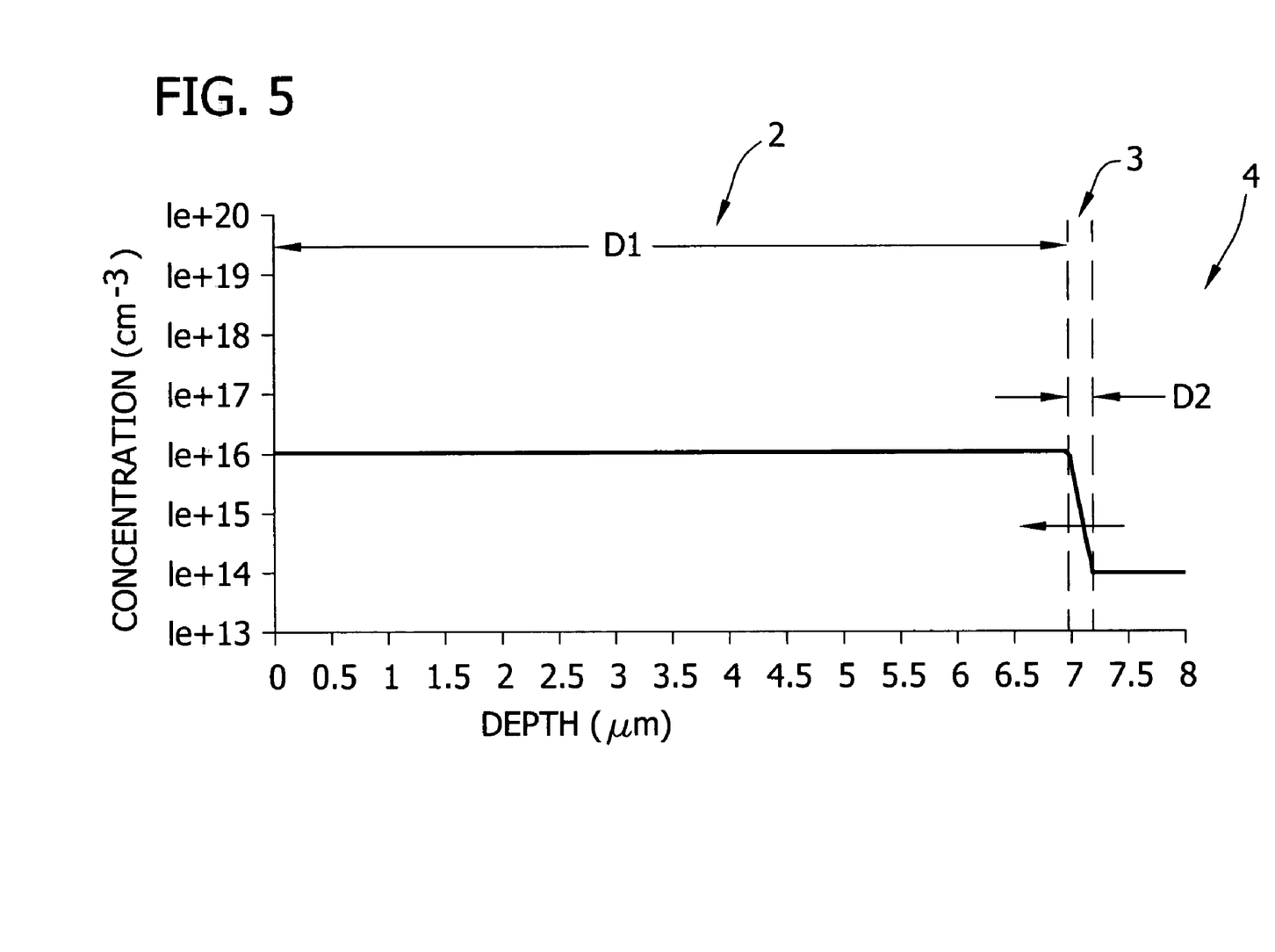
FIG. 5 is another doping concentration profile for a silicon structure of the invention.

As another example, FIG. 5 shows a typical dopant concentration profile for an n-doped silicon structure before formation of an n-well therein, the silicon structure having a surface region 2, a transition region 3, and a bulk region 4. To form an n-well in such an n-doped structure, n-type dopant is implanted in surface region 2 with sufficient energy to form a concentration peak between about 0.01/m and about 0.5 μm below the front surface, which is then diffused to a target depth under a heat treatment at a temperature between about 1000° C. and about 1250° C. The target depth for the n-type dopant concentration peak is between about 0.25 μm and about 1.5 μm below the front surface. As mentioned above, this local concentration peak is selectively formed in discrete areas of the wafer's front surface using an implantation process such as, for example, one of the commonly known masking techniques. Stated otherwise, isolated areas of the wafer's surface are subjected to dopant implantation to form one or more n-wells in the wafer's surface region 2. The concentration peak of the n-well is typically at least about 10 times the dopant concentration of the surface region 2, and preferably at least about 100 times the dopant concentration of the surface region 2. Typically, an additional region of n-doped silicon material is epitaxially deposited over the n-well, the region having a thickness, $D_4$, of between about 0.5 μm and about 5.0 μm. FIG. 5 represents an exemplary dopant concentration profile for an n-type silicon structure after an n-well has been formed therein with an n-type epitaxial layer deposited thereon.

By creating a dopant concentration profile in the silicon structure according to the invention, electronic devices derived therefrom advantageously suppress the collection of excess charge carriers in the transition and near-surface regions. This advantage is realized because the gradient or step of the profile creates an electric field under an applied current that promotes excess charge carrier movement away from the transition and near-surface regions. The magnitude of this field is directly related to the increase in dopant concentration from the bulk region to the near-surface region and is inversely related to $D_2$. That is, a larger dopant concentration change over a shorter distance will produce an electric field of greater magnitude.

Any known method of forming a silicon structure comprising the doping concentration profile of the invention may be used. For example and referring again to FIG. 2, epitaxial deposition may be used to form surface region 2, transition region 3, and part or all of bulk region 4 on a silicon substrate. Epitaxial deposition techniques are well known in the art, e.g., Stanley Wolf & R. N. Tauber, *Silicon Processing for the VLSI Era—Process Technology* (1st ed., Lattice Press 1986), Stephen A. Campbell, *The Science and Engineering of Microelectronic Fabrication* (2nd ed., Oxford University Press 2001), and the process described in U.S. Pat. No. 5,789,309. The dopant concentration is controlled during epitaxial silicon growth according to known methods to create the dopant concentration profile of the invention. For example, when doping the silicon with boron, a high concentration diborane source gas can be mixed with a carrier gas to dope the epitaxial silicon. Alternatively, the silicon structure 1 may be formed using any one of the known direct layer bonding techniques. Such techniques are disclosed in the Wolf et al. and Campbell references mentioned above, as well as in various patents and applications, such as U.S. Patent Application Publication Nos. 2004/0005740 and 2004/0031979. Using a direct layer bonding method, a silicon donor structure comprising the transition region, if any, and the near-surface region is directly bonded to a silicon handle substrate. Subsequent processes well known in the art, such as cleaving, back grinding, etching, lapping, and/or polishing, may be used to form the silicon structure of the invention.

In an optional embodiment, recombination centers are introduced in either the near-surface region or the bulk region. This embodiment provides enhanced protection against radiation-induced failures by trapping excess charge carriers that are not confined to the bulk region by the dopant concentration gradient-generated electric field alone. Recombination centers are any structural features that effectively trap excess charge carriers to prevent further migration, such as structural defects or impurities. Types of recombination centers that may be formed in the bulk region include dislocation loops and oxygen precipitates, which are typically proximate the transition region. Types of recombination centers that may be formed in the near-surface region include nitrogen precipitates or metastable metallic impurities (e.g., Mo, Ti). Such defects or impurities can be introduced to the structure via, e.g., ion implantation, crystal lattice mismatch during structure formation, impurity introduction during structure formation, or point defect engineering. This optional embodiment further enhances the protection provided by the invention's doping concentration profile. As the recombination center concentration increases, protection from failures caused by excess charge carriers increases. As such, when the silicon structure is designed to comprise recombination centers, their concentration is at least about $1 \times 10^{11}$ per cm$^3$, at least about $5 \times 10^{11}$ per cm$^3$, and preferably at least about $1 \times 10^{12}$ per cm$^3$. The exact concentration of recombination centers depends on the type of recombination center employed, as they vary in effectiveness of trapping charge carriers.

Having described the invention in detail, it will be apparent that modifications and variations are possible without departing from the scope of the invention defined in the appended claims.

EXAMPLES

The following non-limiting examples are provided to further illustrate the present invention.

Example 1

Profile for a p-Doped Structure

A silicon structure suitable for use in a digital application was formed using a p-type dopant. FIG. 3 shows the dopant concentration profile of the structure. The near-surface region 2 extended approximately 3 µm below the front surface, the transition region 3 had a thickness of about 0.25 µm, and the bulk region 4 extended at least about 5 µm deeper than the transition region toward the central plane (not fully shown on FIG. 3). The structure was formed using epitaxial deposition, where a high concentration diborane source gas was introduced during epitaxial growth in a concentration sufficient to increase the p-type dopant concentration from about $1 \times 10^{14}$ carriers/cm$^3$ to about $1 \times 10^{16}$ carriers/cm$^3$ over the depth of the transition region. The concentration of diborane source gas was then adjusted to maintain this higher concentration of about $1 \times 10^{16}$ carriers/cm$^3$ over the depth of the near-surface region. Boron was then implanted in designated areas of the front surface with sufficient energy to create a p-well between the front surface and about 1.25 µm below the surface, as shown in FIG. 4, with the concentration peak about 0.5 µm below the front surface.

Example 2

Adding Recombination Centers

A silicon structure was formed according to Example 1 with the addition of recombination centers between about 1.5 µm and about 3.0 µm below the front surface. The recombination centers were formed during epitaxial deposition by introducing Mo as a stable metallic impurity. A sufficient amount of Mo was added to create about $1 \times 10^{12}$ per cm$^3$ recombination centers/cm$^3$.

Example 3

Profile for a p-Doped and n-Doped Structure

A silicon structure suitable for use in an analog application was formed using a p-type dopant to create the dopant concentration profile shown in FIG. 5. Near-surface region 2 extended approximately 6.75 µm below the front surface, transition region 3 had a depth of about 0.25 µm, and bulk region 4 extended at least about 5 µm deeper than the transition region toward the central plane (not fully shown on FIG. 5). The structure was formed using epitaxial deposition, where a high concentration diborane source gas was introduced during epitaxial growth in a concentration sufficient to increase the p-type dopant concentration from about $1 \times 10^{14}$ carriers/cm$^3$ to about $1 \times 10^{16}$ carriers/cm$^3$ over the depth of the transition region. The concentration of diborane source gas was then adjusted to maintain this higher concentration of about $1 \times 10^{16}$ carriers/cm$^3$ over the depth of the near-surface region. Phosphorus was then implanted in designated areas of the front surface with sufficient energy to create a concentration peak of n-type dopant between the front surface and about 1.25 µm below the surface, with a concentration peak about 0.5 µm below the front surface.

Figure 6:
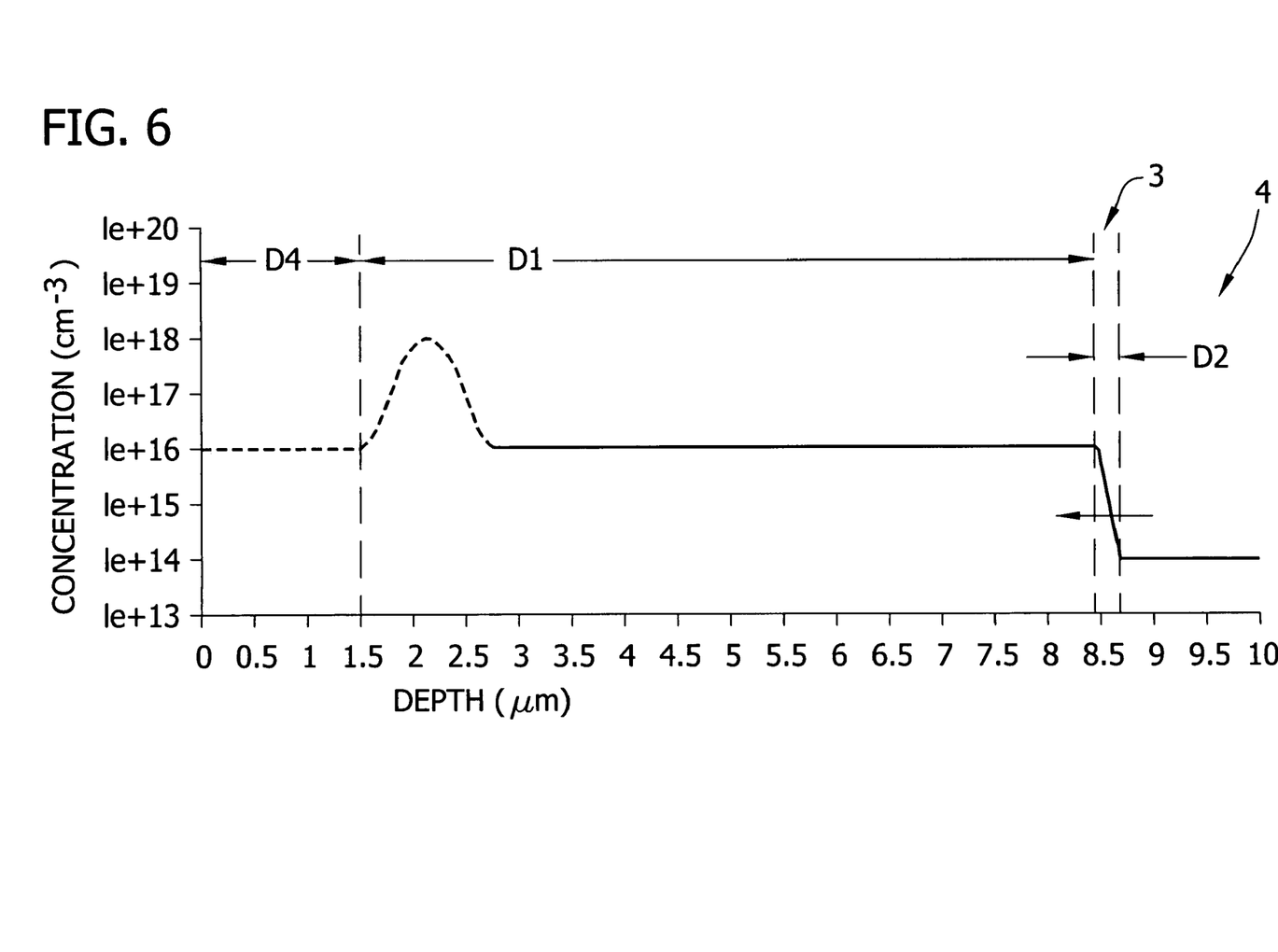
FIG. 6 is a doping concentration profile for a silicon structure of the invention after subsequent n-type doping.

An n-doped epitaxial layer of about 1.5 µm was then formed on these designated areas such that the n-type peak was located about 2 µm below the final surface, as shown in FIG. 6. For clarity, the portion of the dopant concentration profile that represents n-type dopant has been dashed in FIG. 6.

Example 4

Comparison of Structures with Varying Concentration Profiles

Figure 7:
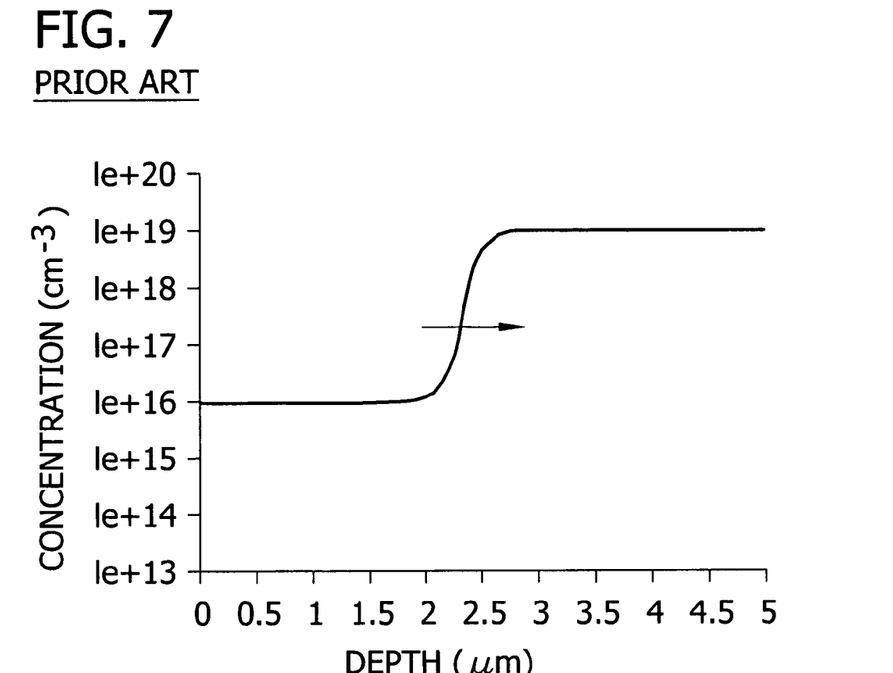
FIG. 7 is a doping concentration profile for a silicon structure of the prior art.
Figure 8:
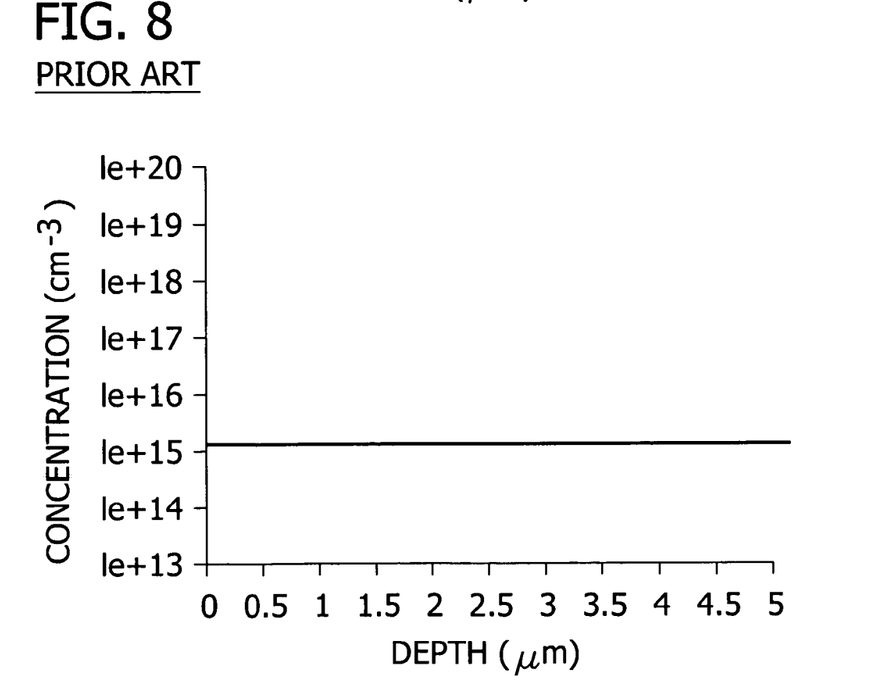
FIG. 8 is a doping concentration profile for a silicon structure of the prior art with no change in dopant concentration

Charge collection simulations were performed on three electronic device models to project the effectiveness of the dopant concentration profile in preventing charge carrier collection in the near-surface region. The first model employed a silicon structure having a dopant concentration profile wherein the dopant concentration significantly decreased from the bulk region to the near-surface region, as commonly found in the prior art and as shown in FIG. 7. FIG. 8 shows the second model, which had a dopant concentration profile where the concentration is approximately the same from what would be the bulk and near-surface regions. The third model employed a silicon structure having a dopant concentration profile according to the invention, as seen in FIG. 3.

The simulations projected the direction of the accompanying electric fields that are generated by the profiles under an applied current. As used herein and as widely accepted in the art, electrons flow in the opposite direction of the electric field. In FIG. 7, the electric field generated under an applied current is denoted by the arrow pointing toward the central plane, indicating that electrons are encouraged to collect on the near-surface region side of the transition region. FIG. 8 does not display an electric field arrow because no electric field is generated where there is no dopant concentration change. Therefore, such a profile does not effectively enhance the silicon structure's resistance to charge carrier migration into the near-surface region. Finally, for the third model, the electric field arrow is shown in FIG. 3 to point toward the near-surface region, indicating that the electric field opposes charge carrier migration across the transition region and into the near-surface region. Therefore, the dopant concentration profile of the invention favors charge carrier migration away from the near-surface region. As noted above, the magnitude of this electric field depends on the magnitude of the dopant concentration change over the distance of the transition region, $D_2$. Larger electric fields will be formed as the concentration change increases and $D_2$ decreases.

Example 5

Figure 9:
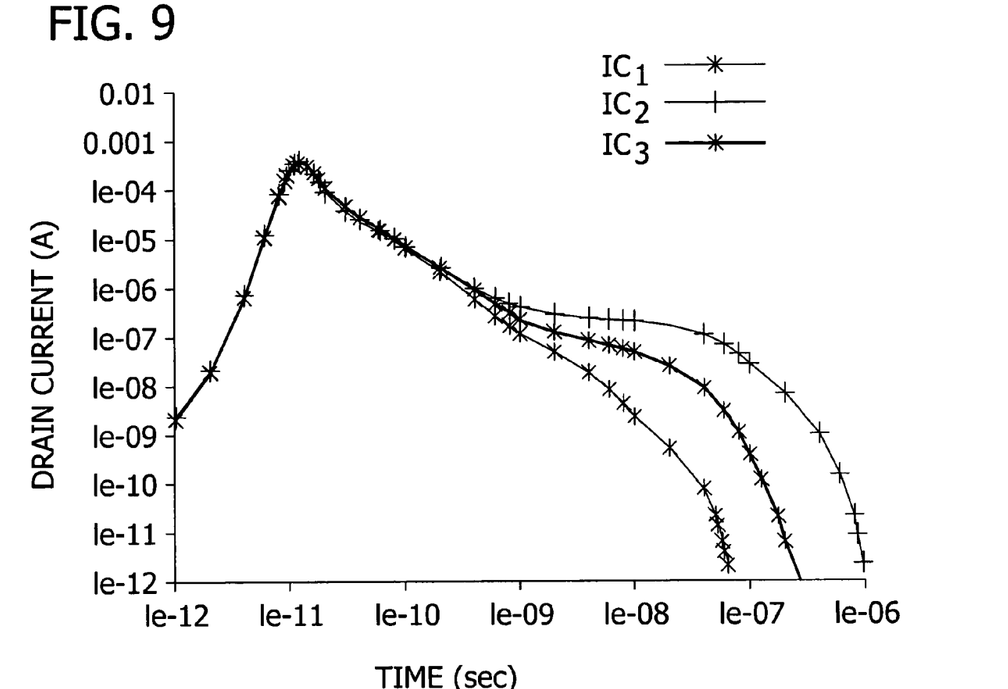
FIG. 9 shows the drainage current for three differently doped electronic devices.

Excess Charge Carrier Collection in Structures with Various Concentration Profiles The effectiveness of the electric field created by the dopant concentration profiles of the three electronic devices of Example 1 can be seen by modeling the current response to a typical radiation event and projecting the charge collection induced by the radiation event. In FIG. 9, the current response is shown for a radiation strike having a magnitude of about 5 MeV on the three electronic device models from Example 1, i.e., those having dopant concentration profiles shown in FIGS. 3, 7, and 8. The models are labeled as follows: $IC_1$ is from FIG. 3, $IC_2$ is from FIG. 7, and $IC_3$ is from FIG. 8. In FIG. 9, it can be seen that all three models experienced a similar initial current surge, but that the current dissipation (i.e., drain current) between the surge and about 1 microsecond depended heavily on the electronic device's dopant concentration profile. Specifically, the electronic device having the dopant concentration profile from FIG. 7 modeled the highest drain current in the nanosecond to microsecond timeframe. In contrast, the electronic device having the dopant concentration profile of the invention, shown in FIG. 3, modeled the lowest drain current of the three profiles, with no appreciable drain current after about $7 \times 10^{-8}$ seconds. The electronic device having the flat dopant concentration profile modeled an intermediate drain current, with no appreciable drain current after about $3 \times 10^{-7}$ seconds.

Figure 10:
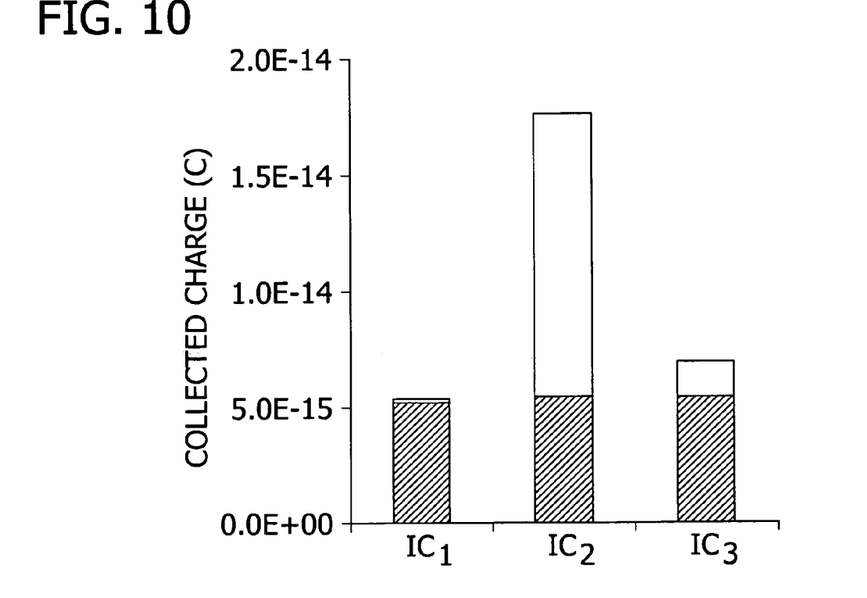
FIG. 10 shows the carrier charge collection for the same three electronic devices from FIG. 9.

Furthermore, testing confirmed that the total number of charge carriers collected in the near-surface region is also dependent on the dopant concentration profile. During the modeling for drain current from a radiation strike, the total charge carrier collection over the first microsecond after the radiation strike was projected. The results are shown in FIG. 10: $IC_1$ projected the least charge carriers collected at about $5.5 \times 10^{-15}$ carriers, whereas $IC_2$ projected the most charge carriers collected during this timeframe at about $1.75 \times 10^{-14}$ carriers. Similar to the current drain data, $IC_3$ projected to collect an intermediate amount of charge carriers of about $7.0 \times 10^{-15}$ carriers. The projections showed that during the first nanosecond, approximately an equivalent amount of charge carriers are collected by each electronic device, which is represented by the hashed portion of the bars. These data confirm that the dopant concentration profile of the invention effectively reduces the drain current and the charge carrier collection resulting from a radiation strike on an electronic device comprising a silicon structure with such a profile.

Example 6

Impact of Recombination Centers

Figure 11:
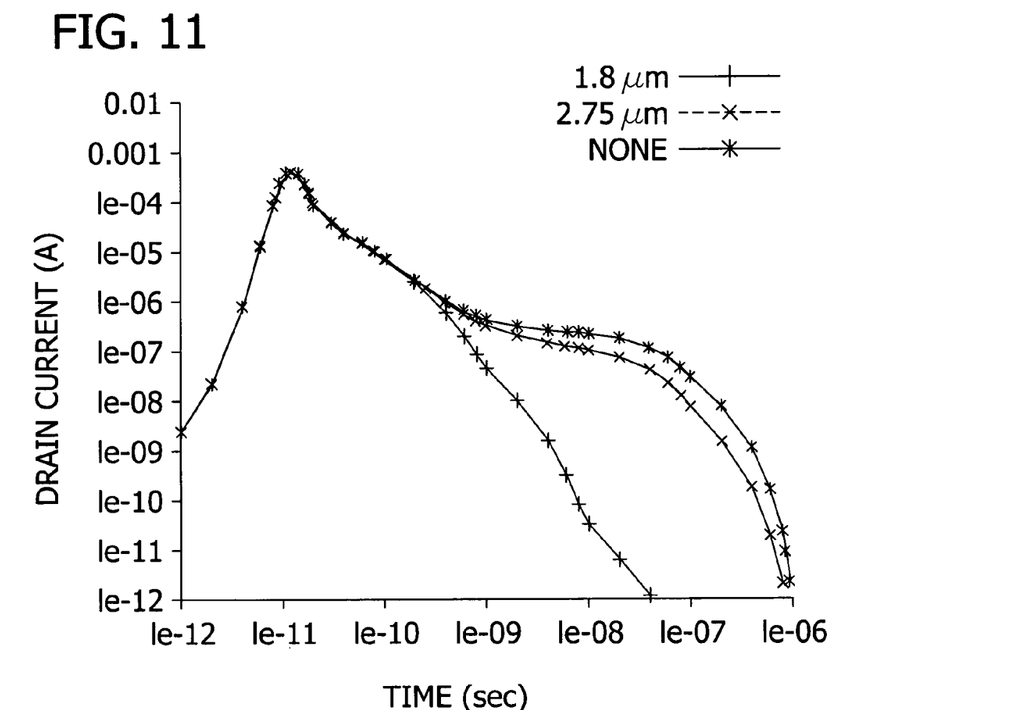
FIG. 11 shows the drainage current for three electronic devices with various recombination profile features.
Figure 12:
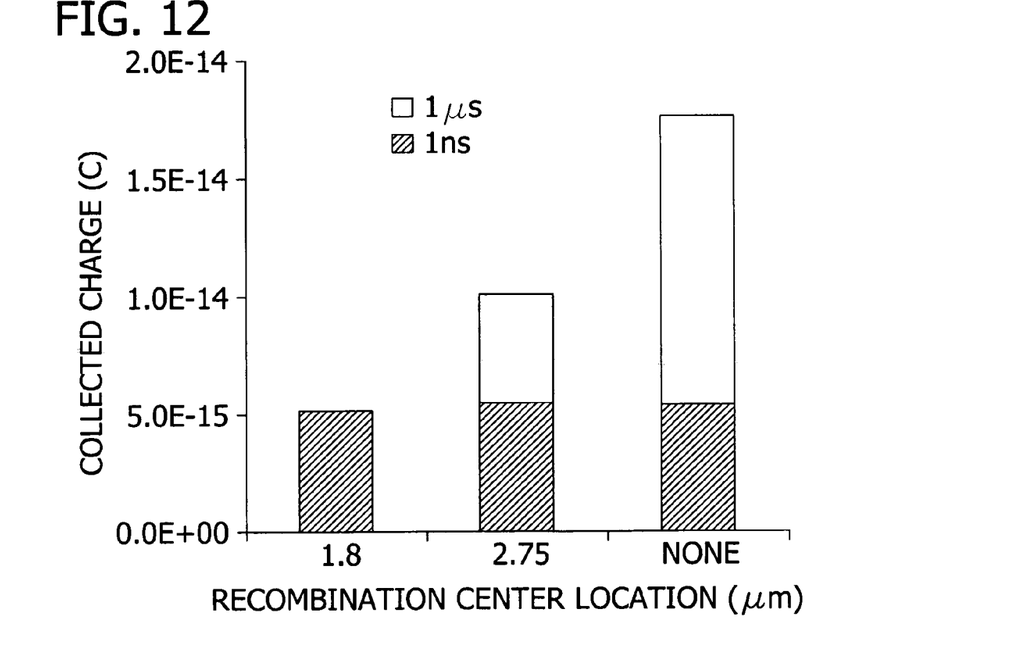
FIG. 12 shows the carrier charge collection for the same three electronic devices from FIG. 11.

To project the impact of optional recombination centers on the migration of excess charge carriers in the silicon structure, two structures with recombination centers situated at differing depths were modeled. To focus on the impact of the recombination centers, the models were doped according to a doping profile similar to that shown in FIG. 7. The first structure model comprised recombination centers at about 1.8 μm from the front surface and the second structure model comprised recombination centers at about 2.75 μm from the front surface. A third structure model was formed without any recombination centers to act as a control structure. The results of projections for how the three structure models would react to a radiation strike of about 5 MeV are shown in FIGS. 11 and 12. FIG. 11 shows that the drain current for the first structure model is drastically lower than that of the second or the third structure models, with minimal drainage current after about $4 \times 10^{-8}$ seconds for the first structure model versus a decline in drainage current after about $1 \times 10^{-6}$ seconds for the second and third structures. FIG. 12 shows that the first structure model permitted about $5 \times 10^{-15}$ carriers to collect in the near-surface region, almost all of which can be attributed to the charge carriers collected during about $2 \times 10^{-10}$ seconds, which is projected as approximately the same amount, regardless of recombination center distribution. The second structure model permitted about $1 \times 10^{-14}$ carriers to collect in the near-surface region, whereas the third structure allowed about $1.75 \times 10^{-14}$ carriers to collect in the near-surface region. These results show that recombination centers drastically reduce the amount of drainage current and charge carrier collection compared to structures without such recombination centers, with greater impact as the recombination centers are positioned closer to the front surface. It should be noted, however, that recombination centers should not be formed in the area of the silicon structure designated for other features, such as a dopant concentration peak or a device region. In other words, there is some minimum distance from the front surface where recombination centers cannot be formed, but this distance will vary depending on the specific location of features such as those mentioned.

When introducing elements of the present invention or the preferred embodiments(s) thereof, the articles "a", "an", "the", and "said" are intended to mean that there are one or more of the elements. The terms "comprising", "including", and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A silicon structure having a central axis, a front surface and a back surface that are generally perpendicular to the central axis, a central plane between and parallel to the front and back surfaces, a circumferential edge, and a radius extending from the central axis to the circumferential edge, wherein the structure further comprises:
   a near-surface region extending substantially from the central axis to the circumferential edge and a distance, $D_1$, of between about 0.5 μm and about 25 μm from the front surface toward the central plane,
   a transition region extending substantially from the central axis to the circumferential edge and a distance, $D_2$, of less than about 1 μm from the near-surface region toward the central plane,
   a bulk region extending substantially from the central axis to the circumferential edge and a distance, $D_3$, of greater than about 5 μm from the transition region toward the central plane,
   wherein the bulk and near-surface regions are doped with a dopant, the concentration of dopant in the near-surface region is at least 10 times the maximum concentration, c, of dopant in the bulk region, and c is greater than about $5 \times 10^{13}$ atoms/cm$^3$.

2. The silicon structure of claim 1 wherein $D_1$ is between about 0.5 μm and about 4 μm.

3. The silicon structure of claim 1 wherein $D_1$ is between about 6 μm and about 10 μm.

4. The silicon structure of claim 1 wherein $D_1$ is between about 10 μm and about 25 μm.

5. The silicon structure of claim 1 further comprising an epitaxial layer, wherein the epitaxial layer comprises the near-surface region and the transition region.

6. The silicon structure of claim 1 wherein the dopant in the bulk region and in the near-surface region is a p-type dopant.

7. The silicon structure of claim 6 wherein the p-type dopant is boron.

8. The silicon structure of claim 1 wherein the dopant in the bulk region and in the near-surface region is an n-type dopant.

9. The silicon structure of claim 8 wherein the n-type dopant is phosphorous.

10. The silicon structure of claim 1 wherein the dopant in the bulk region is a p-type dopant and the dopant in the near-surface region is an n-type dopant.

11. The silicon structure of claim 1 wherein the near-surface region is doped with a dopant in a concentration of at least about 100c.

12. The silicon structure of claim 1 wherein the near-surface region is doped with a dopant in a concentration of at least about 1000c.

13. The silicon structure of claim 1 wherein $D_2$ is about 0 μm.

14. The silicon structure of claim 1 wherein $D_3$ is at least about 10 μm.

15. The silicon structure of claim 1 wherein $D_3$ is at least about 20 μm.

16. The silicon structure of claim 1 wherein the bulk region extends from the transition region to the silicon structure's back surface.

17. The silicon structure of claim 1 wherein c is greater than about $1 \times 10^{14}$ atoms/cm$^3$.

18. The silicon structure of claim 1 wherein c is greater than about $1 \times 10^{15}$ atoms/cm$^3$.

19. The silicon structure of claim 1 wherein the structure further comprises recombination centers.

20. The silicon structure of claim 19 wherein the recombination centers are of a type selected from the group consisting of dislocation loops, oxygen precipitates, nitrogen precipitates, metastable metallic impurities, and combinations thereof.

21. The silicon structure of claim 19 wherein the silicon structure comprises at least about $1 \times 10^{11}$ per cm$^3$ recombination centers/cm$^3$.

22. The silicon structure of claim 19 wherein the silicon structure comprises at least about $1 \times 10^{12}$ per cm$^3$ recombination centers/cm$^3$.

23. A silicon structure having a central axis, a front surface and a back surface that are generally perpendicular to the central axis, a central plane between and parallel to the front and back surfaces, a circumferential edge, and a radius extending from the central axis to the circumferential edge, wherein the structure further comprises:
   a near-surface region extending substantially from the central axis to the circumferential edge and a distance, $D_1$, of between about 2.75 μm and about 3 μm from the front surface toward the central plane,
   a transition region extending substantially from the central axis to the circumferential edge and a distance, $D_2$, of less than about 1 μm from the near-surface region toward the central plane,
   a bulk region extending substantially from the central axis to the circumferential edge and from the transition region to the back surface,
   wherein the bulk region is doped with a dopant in a maximum dopant concentration of about $1 \times 10^{14}$ atoms/cm$^3$ and the near-surface region is doped with a dopant in a concentration of at least about $1 \times 10^{16}$ atoms/cm$^3$.

24. A method for forming a silicon structure on a silicon substrate, the substrate having a central axis, a front surface and a back surface that are generally perpendicular to the central axis, a central plane between and parallel to the front and back surfaces, a circumferential edge, and a radius extending from the central axis to the circumferential edge, the method comprising:
   forming a bulk region in the substrate, the bulk region being doped with a maximum dopant concentration of c wherein c is greater than about $5 \times 10^{13}$ atoms/cm$^3$ and extending substantially from the central axis to the circumferential edge and a distance, $D_3$, from the front surface of the substrate toward the central plane of at least about 5 μm;
   forming a transition region of doped silicon on the front surface of the substrate, the transition region extending substantially from the central axis to the circumferential edge and having a thickness, $D_2$, of less than about 1 μm;
   forming a near-surface region of doped silicon on the transition region, the near-surface region being doped with a dopant concentration of at least about 10 times c and extending substantially from the central axis to the circumferential edge and having a thickness, $D_1$, of between about 0.5 μm and about 25 μm.

25. The method of claim 24 wherein the transition region and the near-surface region are formed by epitaxial deposition.

26. The method of claim 25 wherein the epitaxial deposition is carried out using a high concentration diborane source gas.

27. The method of claim 24 wherein the transition region and the near-surface region are formed by a direct bonding method.

28. The method of claim 24 wherein $D_1$ is between about 0.5 μm and about 4 μm.

29. The method of claim 24 wherein $D_1$ is between about 6 μm and about 10 μm.

30. The method of claim 24 wherein $D_1$ is between about 10 μm and about 25 μm.

31. The method of claim 24 wherein the dopant in the bulk region and in the near-surface region is a p-type dopant.

32. The method of claim 31 wherein the p-type dopant is boron.

33. The method of claim 24 wherein the dopant in the bulk region and in the near-surface region is an n-type dopant.

34. The method of claim 33 wherein the n-type dopant is phosphorous.

35. The method of claim 24 wherein the dopant in the bulk region is a p-type dopant and the near-surface region comprises an n-type dopant.

36. The method of claim 24 wherein the near-surface region is doped with a dopant in a concentration of at least about 100c.

37. The method of claim 24 wherein the near-surface region is doped with a dopant in a concentration of at least about 1000c.

38. The method of claim 24 wherein $D_2$ is about 0 μm.

39. The method of claim 24 wherein $D_3$ is at least about 10 μm.

40. The method of claim 24 wherein $D_3$ is at least about 20 μm.

41. The method of claim 24 wherein the bulk region extends from the transition region to the silicon structure's back surface.

42. The method of claim 24 wherein c is greater than about $1 \times 10^{14}$ atoms/cm$^3$.

43. The method of claim 24 wherein c is greater than about $1 \times 10^{15}$ atoms/cm$^3$.

44. The method of claim 24 further comprising the formation of recombination centers in the structure.

45. The method of claim 44 wherein the recombination centers are of a type selected from the group consisting of dislocation loops, oxygen precipitates, nitrogen precipitates, metastable metallic impurities, and combinations thereof.

46. The method of claim 44 wherein the silicon structure comprises at least about $1 \times 10^{11}$ per cm$^3$ recombination centers/cm$^3$.

47. The method of claim 44 wherein the silicon structure comprises at least about $1 \times 10^{12}$ per cm$^3$ recombination centers/cm$^3$.

48. The method of claim 44 wherein the recombination centers are formed before forming the transition region and the near-surface region.

49. The method of claim 44 wherein the recombination centers are formed during formation of the near-surface region.

* * * * *